United States Patent
Malik et al.

(10) Patent No.: US 10,704,141 B2
(45) Date of Patent: Jul. 7, 2020

(54) IN-SITU CVD AND ALD COATING OF CHAMBER TO CONTROL METAL CONTAMINATION

(71) Applicant: Applied Materials, Inc., Santa Clara, CA (US)

(72) Inventors: Sultan Malik, Sacramento, CA (US); Srinivas D. Nemani, Sunnyvale, CA (US); Qiwei Liang, Fremont, CA (US); Adib Khan, Santa Clara, CA (US); Maximillian Clemons, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/383,354

(22) Filed: Apr. 12, 2019

(65) Prior Publication Data

US 2019/0368035 A1    Dec. 5, 2019

Related U.S. Application Data

(60) Provisional application No. 62/679,410, filed on Jun. 1, 2018.

(51) Int. Cl.
*C23C 16/44* (2006.01)
*C23C 16/40* (2006.01)
(Continued)

(52) U.S. Cl.
CPC .......... *C23C 16/4404* (2013.01); *C23C 16/22* (2013.01); *C23C 16/24* (2013.01);
(Continued)

(58) Field of Classification Search
None
See application file for complete search history.

(56) References Cited

U.S. PATENT DOCUMENTS

| 4,524,587 A | 6/1985 | Kantor |
| 5,050,540 A | 9/1991 | Lindberg |

(Continued)

FOREIGN PATENT DOCUMENTS

| CN | 101871043 A | 10/2010 |
| CN | 104047676 A | 9/2014 |

(Continued)

OTHER PUBLICATIONS

Pedestal definition from Dictionary.com, printed on Feb. 10, 2020 (Year: 2020).*

(Continued)

*Primary Examiner* — Jiong-Ping Lu
(74) *Attorney, Agent, or Firm* — Patterson + Sheridan, LLP

(57) ABSTRACT

Embodiments of the systems and methods herein are directed towards forming, via ALD or CVD, a protective film in-situ on a plurality of interior components of a process chamber. The interior components coated with the protective film include a chamber sidewall, a chamber bottom, a substrate support pedestal, a showerhead, and a chamber top. The protective film can be of various compositions including amorphous Si, carbosilane, polysilicon, SiC, SiN, $SiO_2$, $Al_2O_3$, AlON, $HfO_2$, or $Ni_3Al$, and can vary in thickness from about 80 nm to about 250 nm.

20 Claims, 2 Drawing Sheets

(51) Int. Cl.
 C23C 16/22      (2006.01)
 C23C 16/30      (2006.01)
 H01J 37/32      (2006.01)
 C23C 16/24      (2006.01)
 C23C 16/455     (2006.01)

(52) U.S. Cl.
 CPC .............. *C23C 16/30* (2013.01); *C23C 16/40* (2013.01); *C23C 16/401* (2013.01); *C23C 16/402* (2013.01); *C23C 16/403* (2013.01); *C23C 16/4405* (2013.01); *C23C 16/45525* (2013.01); *H01J 37/3288* (2013.01); *H01J 37/32862* (2013.01)

(56) References Cited

U.S. PATENT DOCUMENTS

| | | |
|---|---|---|
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |
| 5,366,905 A | 11/1994 | Mukai |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Li et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1* | 6/2002 | Frankel ............... C23C 16/401 118/715 |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1* | 9/2007 | Fischer ............... C23C 16/4404 118/723 R |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |

(56) References Cited

U.S. PATENT DOCUMENTS

| | | |
|---|---|---|
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0350563 A1 | 12/2018 | Manna et al. |
| 2019/0259625 A1 | 8/2019 | Nemani et al. |

FOREIGN PATENT DOCUMENTS

| | | |
|---|---|---|
| CN | 104089491 A | 10/2014 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

International Search Report and Written Opinion for PCT/US2018/021715 dated Jun. 22, 2018.

International Search Report and Written Opinion from PCT/US2018/034036 dated Aug. 24, 2018.

International Search Report and Written Opinion dated Aug. 24, 2018 for Application No. PCT/US2018/034284.

International Search Report, Application No. PCT/US2018/028258 dated Aug. 9, 2018.

International Search Report and Written Opinion for PCT/US2018/035210 dated Aug. 24, 2018.

International Search Report and Written Opinion for PCT/US2018/037539 dated Oct. 5, 2018.

International Search Report and Written Opinion for PCT/US2018/038822 dated Oct. 26, 2018.

Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.

Kato, T. et al., "Heat Transfer Characteristics of a Plate-Fin Type Supercritical/Liquid Helium Heat Exchanger", ICEC 14 Proceedings Supplement, 1992, pp. 260-263.

Lee, Ho-Saeng et al., "The cooling heat transfer characteristics of the supercritical CO2 in mico-fin tube", Springer, Oct. 2, 2012, pp. 173-184.

International Search Report and Written Opinion dated Nov. 30, 2018 for Application No. PCT/US2018/041688.

International Search Report and Written Opinion for PCT/US2018/043160 dated Jan. 31, 2019.

International Search Report and Written Opinion dated Jan. 31, 2019 for Application No. PCT/US2018/042760.

International Search Report and Written Opinion for PCT/US2018/059643 dated Feb. 26, 2019.

International Search Report and Written Opinion from PCT/US2019/012161 dated Apr. 30, 2019.

International Search Report and Written Opinion for PCT/US2019/014759 dated May 14, 2019.

International Search Report and Written Opinion for PCT/US2019/015332 dated May 15, 2019.

International Search Report and Written Opinion for PCT/US2018/059676 dated May 23, 2019.

International Search Report and Written Opinion for PCT/US2019/023431 dated Jul. 5, 2019.

Haskel Pressure on Demand, Pneumatic and Hydraulic Driven Gas Boosters, Apr. 30, 2016, 36 pp.

Taiwan Office Action dated Jul. 3, 2019 for Application No. 107136181.

International Search Report and Written Opinion for International Application No. PCT/US2019/029602 dated Aug. 14, 2019.

Taiwan Office Action dated Jun. 11, 2019 for Application No. 107138905.

Taiwan Office Action dated Nov. 19, 2019 for Application No. 108103415.

Office Action for Japanese Application No. 2018-517285 dated Oct. 23, 2019.

Office Action for Taiwan Patent Application No. 108111501 dated Nov. 14, 2019.

(56) References Cited

OTHER PUBLICATIONS

Office Action for Japanese Application No. 2018-546484 dated Oct. 8, 2019.
International Search Report and Written Opinion for International Application No. PCT/US2019/040195 dated Oct. 25, 2019.

* cited by examiner

IN-SITU CVD AND ALD COATING OF CHAMBER TO CONTROL METAL CONTAMINATION

PRIORITY CLAIM

This application claims priority to U.S. Provisional Patent Application No. 62/679,410, "In-Situ CVD and ALD Coating of Chamber to Control Metal Contamination," filed Jun. 1, 2018, incorporated by reference in its entirety herein.

BACKGROUND

Field

Embodiments of the present disclosure generally relate to apparatuses, systems and methods for processing one or more substrates, and more specifically to apparatuses, systems and methods for process chamber preparation.

Description of the Related Art

Substrate process chambers may be subject to high temperatures above 200° C. and high pressures above 1 bar, which creates a harsh, corrosive environment which can lead to the degrading of the internal components of the process chambers. The internal components are exposed to these high temperature and high pressure environments, especially in combination with process gases introduced to the process chamber during substrate processing. Various coatings and films may be employed to reduce this corrosion, however, those coatings and films may not be robust enough to withstand the processing conditions and may corrode or otherwise degrade during the use of the process chamber. This corrosion can negatively impact the substrate(s) processed, for example, by the corroded surface flaking or peeling or otherwise disassociating and falling on to the substrate and contaminating the substrate.

Thus, there is a need in the art for improved protection of the internal components of process chambers.

SUMMARY

Various methods of forming protective films on surfaces including interior surfaces of a process chamber are discussed herein. In one example, the method includes forming, via ALD or CVD, in a process chamber, a protective film on a plurality of interior components comprising a chamber sidewall, a chamber bottom, a substrate support pedestal, a showerhead, and a chamber top; and positioning, subsequent to forming the protective film, a substrate on the substrate support pedestal. The substrate is in contact with a portion of the substrate support pedestal that does not comprise the protective film.

In another example, a method of protecting a process chamber, includes: introducing at least one gas to a process chamber; removing, in response to the positioning of the at least one gas in the process chamber, a first protective film from a plurality of interior components of the process chamber. The method further includes forming, via ALD or CVD, in the process chamber, a second protective film on the plurality of interior components, wherein the second protective film comprises amorphous Si, carbosilane, polysilicon, SiC, SiN, $SiO_2$, $Al_2O_3$, AlON, $HfO_2$, or $Ni_3Al$. Furthermore in this example, the method includes positioning, subsequent to forming the second protective film, a substrate on a substrate support pedestal.

In another example, a method of processing a substrate includes introducing at least one gas to a process chamber; removing, in response to the positioning of the at least one gas in the process chamber, a first protective film from a plurality of interior components of the process chamber. The method further includes forming, via ALD or CVD, in the process chamber, a second protective film on the plurality of interior components, wherein the second protective film comprises amorphous Si, carbosilane, polysilicon, SiC, SiN, $SiO_2$, $Al_2O_3$, AlON, $HfO_2$, or $Ni_3Al$. The method further includes positioning, subsequent to forming the second protective film, a substrate on a substrate support pedestal.

DETAILED DESCRIPTION

Figure 1:
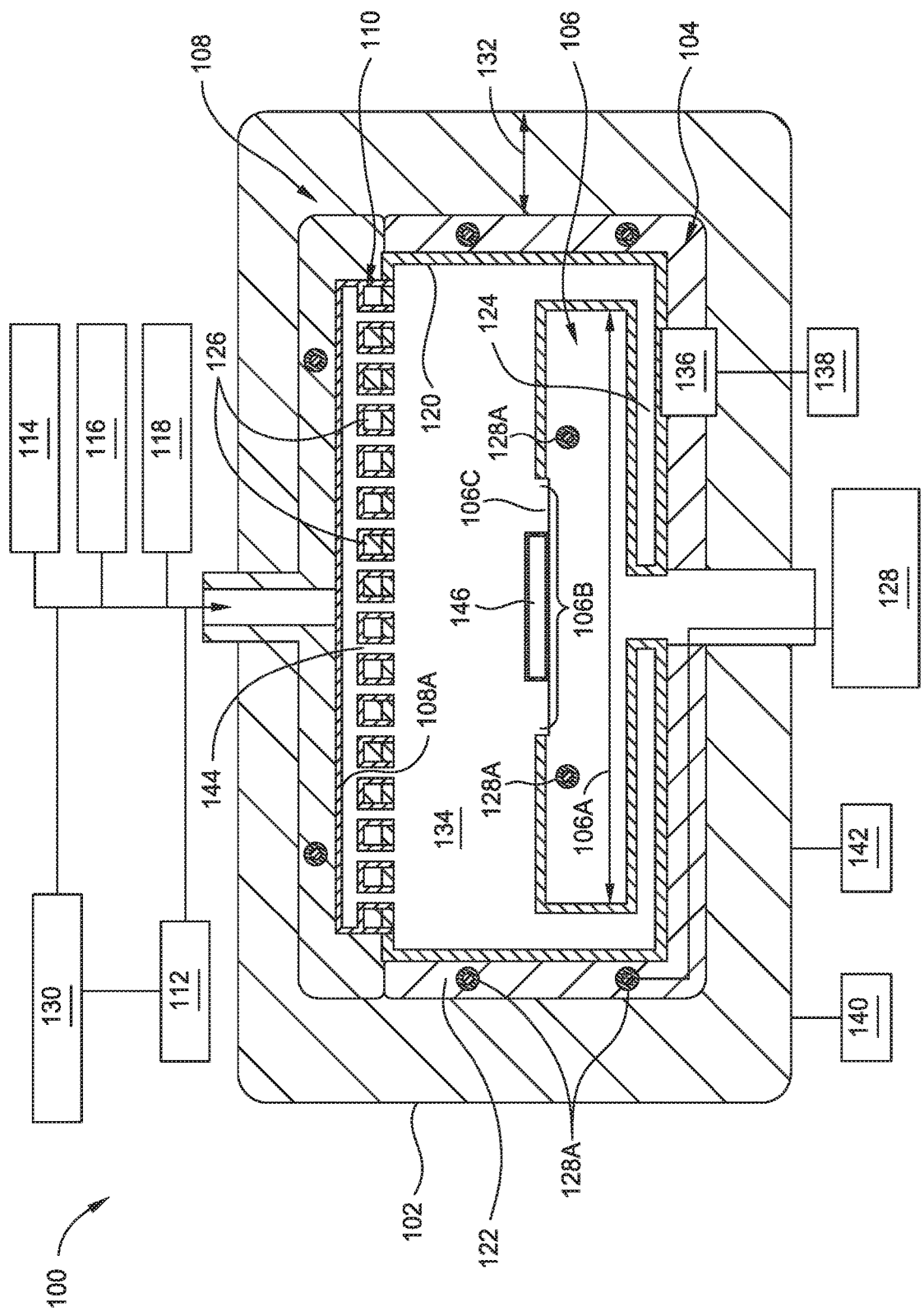
FIG. 1 is a cross-sectional view of an example substrate process chamber according to certain embodiments of the present disclosure.

Systems and methods discussed herein relate to the preparation of substrate process chambers such that the process chambers are able to withstand sustained processing temperatures above 400° C. without corrosion or other degradation of the internal components of the process chamber. The internal components of a process chamber can be formed from aluminum, stainless steel, nickel-based superalloys, or other materials that can be degraded by high temperatures, high pressure, and/or by etchant gases in the process chamber. The degradation of internal components can lead to metallic particulate matter from one or more internal components contaminating one or more substrates positioned in the process chamber. This contamination negatively impacts both the instant processing in the process chamber as well as downstream operations. Furthermore, the degradation of internal process chamber components reduces the life of the internal components, which increases maintenance and downtime costs.

The protective films discussed herein protect the internal components of process chambers from corrosion and erosion, reducing the incidents of contamination of the process chamber and the substrates fabricated therein. The protective films are used to protect process chambers, including high pressure process chambers that operate under a pressure of 1 bar or more, from corrosion. The protective films are formed in-situ inside of an inner chamber body of a process chamber using chemical vapor deposition (CVD) or atomic layer deposition (ALD). The protective films are formed on some or all exposed surfaces of the inner chamber body, including the inner chamber body walls, showerhead, and on at least a portion of a substrate support pedestal. In one example, the showerhead of the process chamber is employed to distribute one or more precursors from which the protective film is formed. In some embodiments, a protective cover is placed on some or all of a top surface of the substrate support pedestal in the process chamber. The protective cover can be positioned on the substrate support pedestal such that an area on the pedestal that is equal to or greater than a diameter of a substrate is not coated by the protective film during deposition. The protective cover can be used to protect the backside of the substrate from contamination from the protective film, which can negatively impact downstream operations. In one example, when a substrate is positioned in the process chamber on the substrate support pedestal after the protective film has been deposited, the substrate is not in contact with the protective film. In alternate embodiments, no protective cover is used. In this example, the entire surface of the substrate support pedestal, including where one or more substrates are positioned for processing, is covered with the protective film.

The protective film may be formed in-situ and removed in-situ after one or more substrates or batches of substrates are processed in the process chamber. In contrast, ex-situ coating of process chambers can have challenges such as downtime from re-coating. The substrate processing in the process chamber that includes the protective film, or in other chambers, subsequent to the formation of the protective film, may include the deposition of one or more layers. The formation of a plurality of features of varying aspect ratios, and/or may in some embodiments include processing substrates with hardmasking, including patterning the hardmask. In an embodiment, the removal of the protective film may be performed using one or more gases, including fluorine (F) gas or nitrogen trifluoride ($NF_3$) gas. The F or $NF_3$ gas can be ionized into a plasma in a remote plasma source (RPS) or in-situ in the process chamber. In one example, an RPS is used to form a $NF_3$ plasma. Subsequent to protective film removal, a new protective film of the same or of a different composition than the previously applied protective film may be applied to the inner chamber body. The protective film is formed from materials including amorphous silicon (a-Si), carbosilane, polysilicon, silicon carbide (SiC), silicon nitride (SiN), silicon dioxide ($SiO_2$), aluminum oxide ($Al_2O_3$), aluminum oxynitride (AlON), hafnium oxide ($HfO_2$), nickel aluminide ($Ni_3Al$), or combinations thereof. The use of the protective films discussed herein thus increases the life of the internal components of the process chamber and reduces scrap caused by corrosion of those components.

FIG. 1 is a cross-sectional view of an example process chamber 100 according to certain embodiments of the present disclosure. The process chamber 100 has a protective film 120 formed according to certain embodiments of the present disclosure. The process chamber 100 includes an outer chamber body 102 formed around an inner chamber body 104. In an embodiment, the outer chamber body 102 includes aluminum and the inner chamber body 104 includes stainless steel. In alternate embodiments, the outer chamber body 102 includes aluminum and the inner chamber body 104 includes quartz, aluminum, or a nickel-based superalloy such as Hastealloy®. The inner chamber body 104 may be defined by chamber walls 122, a chamber bottom 124, and a chamber top 108A formed by a bottom surface of a chamber lid 108. In an embodiment, a vacuum is formed in a space 132 in between the outer chamber body 102 and the inner chamber body 104. In an embodiment, the chamber walls 122, the chamber bottom 124, the chamber top 108A, and additional components discussed herein may be formed from one or more materials such as stainless steel, quartz, nickel-based superalloy, or aluminum. The inner chamber body 104 is exposed to high temperatures, pressures, and, in some examples, etchant gases, which can corrode and degrade the inner chamber body 104 components. In one example, the process chamber 100 is coupled to a remote plasma source (RPS) 112, a gas panel 118, a condenser 114, and a steam generator 116.

In an embodiment during operation of the process chamber 100, the process chamber 100 can be pressurized and have the temperature controlled in various manners. In one example, the pressure within a processing space 134 is controlled using a throttle valve 136 situated between inner chamber body 104 and a vacuum pump 138. The temperature at the surface of the chamber walls 122 is controlled using one or more heating elements 128A. The one or more heating elements 128A can be solid or liquid-containing elements that are located in the chamber walls 122 and/or the chamber lid 108 of the inner chamber body 104. In some examples, one or more heating elements 128A are disposed in a substrate support pedestal 106. In one example, the chamber lid 108 can be heated from 100° C. to 300° C. The plurality of heating elements 128A may be disposed in the chamber walls 122 of the inner chamber body 104 and electrically coupled to a power source 128. In the example in FIG. 1 the heating elements 128A are shown as two pairs of heating elements 128A disposed in or coupled to the chamber walls 122, one pair of heating elements 128A disposed in or coupled to the substrate support pedestal 106, and one pair of heating elements 128A disposed in or coupled to the chamber lid 108. In alternate embodiments, more or less heating elements 128A than illustrated in FIG. 1 may be employed in various configurations in the chamber walls 122, the chamber lid 108, and, in some embodiments, inside of or coupled to the substrate support pedestal 106. In one example of etching in the process chamber 100, chemically reactive ions are released from a plasma that can be introduced via the RPS 112 or formed in the process chamber 100 via other means as discussed below. The chemically reactive ions, once released from the plasma, strike a substrate 146 positioned on the substrate support pedestal 106. When the chemically reactive ions strike the substrate, exposed material from a surface of the substrate 146 is removed.

In another example of the process chamber 100, plasma can be generated using a RF source power 140 and an RF bias power 142. Each of the RF source power 140 and the RF bias power 142 is coupled to the process chamber 100 and configured to apply power, and in some examples pulses of power, to the chamber walls 122 and/or the substrate support pedestal 106. A negative bias can also be applied to the substrate support pedestal 106 in some examples. In one example, the gaseous mixture formed inside the processing space 134 from gas sources (not shown) coupled to the gas panel 118 is ignited into plasma by applying RF power from the RF source power 140 to a plurality of antenna segments (not pictured).

Further in the process chamber 100, a showerhead 110 is removably coupled to the process chamber 100 near the chamber top 108A. The showerhead 110 is used to distribute a plurality of gases, for example, gases supplied through the gas panel 118, in the inner chamber body 104. The showerhead 110 can be used to distribute gas and gas mixtures during substrate processing operations, and during the deposition and removal of the protective film discussed herein, or in other cleaning operations performed inside of the process chamber 100. The showerhead 110 may include a plurality of islands 126 and a plurality of spaces 144 formed between each adjacent pair of islands 126. The islands 126 are connected (not shown here) such that gas flows through the showerhead 110 and into the processing space 134, in particular, the gas flows through the showerhead 110 in between the spaces 144 and into the processing space 134. Thus, when a protective film 120 is formed as discussed herein, since the showerhead 110 is used to form the protective film 120, the protective film is formed on surfaces of the showerhead 110 that are exposed to the gaseous components used to form the protective film 120. The protective film 120 is also formed on the exposed surfaces of the inner chamber body 104, including the chamber walls 122. In some examples, which can be combined with other examples herein, one or more of the lid 108A, the substrate support pedestal 106, and the chamber bottom 124, as well as any other exposed surfaces can also have the protective film 120 formed thereon.

In an embodiment, controller 130 is coupled to the process chamber 100 and configured to execute a plurality of instructions. In one example, the plurality of instructions executed by the controller 130 is associated with substrate processing. The substrate processing can include operations such as layer deposition and patterning, as well as chamber cleaning. In another example, the plurality of instructions executed by the controller 130 is associated with forming the protective film 120 on one or more of the chamber walls 122, bottom, 124, top 108A, substrate support pedestal 106, or other exposed surfaces of the inner chamber body 104. In an embodiment, a protective cover (not shown) may be positioned on the substrate support pedestal 106 that covers some or all of a diameter 106A of the substrate support pedestal 106. Thus, optionally, a portion of the substrate support pedestal 106, shown as an uncoated region 106B in this example, is not coated with the protective film 120 and remains exposed. The protective film 120 may be formed on the showerhead 110 as well, and may be formed to an average thickness from 80 nm to 250 nm or from 90 nm to 120 nm. In some examples, an average thickness of the protective film 120 is about 100 nm. In alternate examples, which can be combined with other examples herein, no protective cover is used and the area indicated by the diameter 106A is coated with the protective film 120.

During operation of the process chamber 100, subsequent to forming the protective film 120, the substrate 146 is placed on the substrate support pedestal 106 in the uncoated region 106B of the substrate support pedestal 106. Gaseous components are supplied from a gas panel 118 to the process chamber 100 through the plurality of islands 126 of the showerhead 110, which act as entry ports for the gas. The one or more gaseous components are supplied simultaneously from the gas panel 118, or in an alternating and/or iterative fashion, to form a gaseous mixture in the processing space 134. The protective film 120 can be removed by forming a F or $NF_3$ plasma in the process chamber 100 (or introducing the plasma via the RPS 112) via the showerhead 110 to remove the protective film 120. The removal of the protective film 120 can occur after one or more cycles in the process chamber, for example, after one or more films (not shown here) are formed on the substrate 146, or after a plurality of films are formed, or a plurality of films are patterned, or combinations thereof.

In an embodiment, during substrate 146 processing, the temperature of the substrate 146 positioned in the process chamber 100 is controlled by stabilizing the temperature of the substrate support pedestal 106. Helium or another gas from the gas panel 118 is flowed into a plenum (not shown) defined between the substrate 146 and a support surface 106C of the substrate support pedestal 106. The substrate 146 is seated in the uncoated region 106B. The helium gas is used to facilitate heat transfer between the substrate 146 and the substrate support pedestal 106. During a process in the process chamber 100, which can include an etch process, the substrate 146 is gradually heated by the plasma to a steady state temperature between 200° C. and 600° C. Using thermal control of both the top of the chamber 108A and the substrate support pedestal 106, and in some cases, of the chamber walls 122, the substrate 146 is maintained at a predetermined temperature during processing. When the process chamber 100 is used at high temperatures and/or under high pressures, the inner chamber body 104 is exposed to a harsh environment. The presence of etchant gases in the process chamber 100 can further contribute to the harsh environment experienced by the inner chamber body 104. The protective film 120 thus protects the inner chamber body 104, preventing degradation of one or more of the chamber top 108A, the chamber bottom 124, the chamber walls 122, the showerhead 110, or the substrate support pedestal 106.

Figure 2:
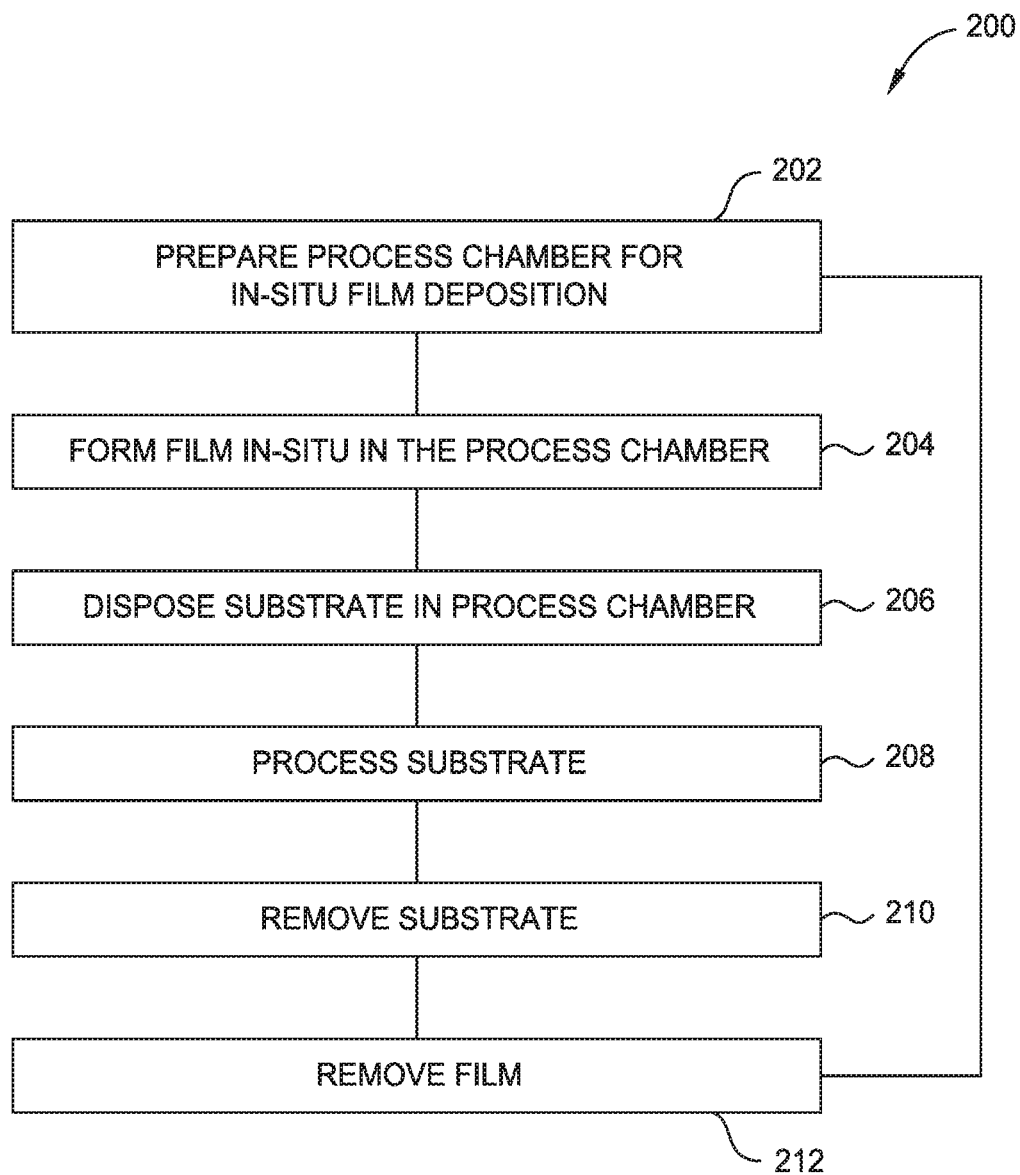
FIG. 2 is a method of in-situ formation of a protective film in a process chamber according to certain embodiments of the present disclosure.

FIG. 2 is a method 200 of in-situ formation of a protective film such as protective film 120 in a process chamber that may be similar to the process chamber 100 in FIG. 1. In the method 200, at operation 202, a process chamber is prepared for in-situ protective film formation. The preparation of the process chamber at operation 202 may include heating the process chamber to a temperature from about 300° C. to about 600° C. and establishing a vacuum in between an outer chamber body and an inner chamber body using, for example, $N_2$. The preparation at operation 202 may further include establishing a pressure in the inner chamber body from about 1 Torr to about 600 Torr. The preparation at operation 202 can be performed while a vacuum is maintained in between the inner chamber body and the outer chamber body.

At operation 204, subsequent to preparing the process chamber at operation 202, a protective film is formed on a plurality of interior components of the process chamber, which may alternatively be referred to as exposed surfaces. The protective film is formed at operation 204 using precursors as discussed below to a target thickness, which can be from 80 nm to 250 nm. The interior components include at least one of a substrate support pedestal, inner chamber body wall, top, bottom, and on the showerhead features, as discussed in FIG. 1. In one example, the protective film formed at operation 204 is formed using chemical vapor deposition (CVD),In another example, the protective film formed at operation 204 is formed using atomic layer deposition (ALD). In an embodiment, regardless of whether CVD or ALD is used at operation 204, the process chamber is under a pressure from 2 Torr to 30 Torr. In another example, which can be combined with other examples herein, a temperature of the process chamber is from 250° C. to 750° C. at operation 204. In still another example, which can be combined with other examples herein, at operation 204 one or more gases such as $Si_2H_6$ $SiH_4$, $N_2$, $N_2O$, $NH_3$, Ar, or $H_2$ are present in the process chamber. In an example where ALD is used at operation 204, the ALD precursors tetrakis(ethylmethylamide)hafnium(IV) (TEMAH) and aluminum trimethanide (TMA) are used in the ALD chamber along with one or more precursors to form the protective film having a composition of $Al_2O_3$, AlON, $HfO_2$, or $Ni_3Al$. In another embodiment, the ALD at operation 204 forms the protective film to a composition that includes one or more of of amorphous Si, carbosilane, polysilicon, SiC, SiN, or $SiO_2$.

The protective film formed at operation 204 may be formed to an average thickness from 80 nm to 250 nm. Operations 202 and 204 are executed without a substrate positioned in the process chamber. At operation 206, a substrate or batch of substrates (2 or more) are positioned in the process chamber and subsequently processed at operation 208. The substrate(s) positioned in the process chamber can be positioned on the substrate support pedestal. In an embodiment, processing the substrate(s) at operation 208 includes forming a plurality of features in the substrate(s). During the processing at operation 208, a temperature of the process chamber may be from about 200° C. to about 600° C. or higher, and a pressure of the process chamber may be from 1 bar to about 250 bar.

Subsequent to the processing at operation 208, the substrates are removed from the process chamber at operation 210. In an embodiment, subsequent to the removal of the substrate at operation 210, the protective film formed at operation 204 is removed at operation 212. The removal of the film at operation 212 may be performed using a fluorine-containing plasma or other suitable cleaning agents. The showerhead of the process chamber can be used to distribute these components. During the removal of the film at operation 210, the process chamber can be purged with an inert gas after the cleaning agent(s) are used. The protective film guards the interior of the process chamber from corrosion, which can not only degrade the integrity of the process chamber's components from a performance standpoint during processing operations such as those of operation 208. However, protective films can also pose a contamination risk during substrate processing, for example, if portions of the films flake or otherwise fall off on to the substrate. The film formed at operation 204 can thus be formed and removed after each substrate or batch of substrates processed at operation 208. Using the systems and methods discussed herein, protective films of differing compositions and thicknesses can be formed on the same chamber components. In an embodiment, more than one substrate or batch of substrates may be processed and removed at operations 208-210 before the film is removed at operation 212.

In-situ coating, where a device or apparatus such as the process chambers discussed herein is coated from inside of the process chamber, is used herein to provide a protective coating of uniform thickness. In some examples, the protective coatings discussed herein can be formed on interior components of process chambers used for high-pressure applications of 1 bar or higher. This is in contrast to ex-situ coating, which, for corrosive, high pressure applications, can flake or otherwise detach from the coated component. This degradation of the protective coating can lead to frequent re-coating operations.

While the foregoing is directed to embodiments of the present disclosure, other and further embodiments of the disclosure may be devised without departing from the basic scope thereof, and the scope thereof is determined by the claims that follow.

The invention claimed is:
1. A method of processing a substrate, comprising:
introducing at least one gas to a process chamber;
removing, in response to the introducing of the at least one gas in the process chamber, a first protective film from a plurality of interior components of the process chamber;
forming, via ALD or CVD, in the process chamber, a second protective film on the plurality of interior components comprising a chamber sidewall, a chamber bottom, a substrate support pedestal, a showerhead, and a chamber top; and
positioning, subsequent to forming the second protective film, a substrate on the substrate support pedestal, wherein the substrate is in contact with a portion of the substrate support pedestal that does not comprise the second protective film.
2. The method of claim 1, further comprising, prior to the forming of the second protective film, heating the process chamber to a pre-heating temperature from about 300° C. to about 600° C., wherein the forming of the second protective film occurs while the chamber is at the pre-heating temperature.
3. The method of claim 1, further comprising, prior to the forming of the second protective film, pressurizing the chamber to a pressure from about 1 Torr to about 600 Torr.
4. The method of claim 1, further comprising, prior to positioning the substrate on the substrate support pedestal, setting a processing temperature of the chamber from about 200° C. to about 600° C.
5. The method of claim 4, further comprising:
subsequent to positioning the substrate, performing at least one operation in the process chamber;
subsequently, removing the substrate from the process chamber; and
cleaning the chamber, wherein cleaning the chamber removes the second protective film from the plurality of interior components of the chamber.
6. The method of claim 5, further comprising removing the second protective film from the plurality of interior components of the process chamber using a fluorine-containing plasma.
7. The method of claim 5, wherein the second protective film comprises amorphous Si, carbosilane, polysilicon, SiC, SiN, $SiO_2$, $Al_2O_3$, AlON, $HfO_2$, or $Ni_3Al$.
8. A method of protecting a process chamber, comprising:
introducing at least one gas to a process chamber;
removing, in response to the introducing of the at least one gas in the process chamber, a first protective film from a plurality of interior components of the process chamber;
forming, via ALD or CVD, in the process chamber, a second protective film on the plurality of interior components, wherein the second protective film comprises amorphous Si, carbosilane, polysilicon, SiC, SiN, $SiO_2$, $Al_2O_3$, AlON, $HfO_2$, or $Ni_3Al$; and
positioning, subsequent to forming the second protective film, a substrate on a substrate support pedestal.
9. The method of claim 8, further comprising forming the second protective film to a thickness from 80 nm to 250 nm.
10. The method of claim 8, wherein the first protective film comprises a first material and the second protective film comprises a second material, wherein the first material is different than the second material.
11. The method of claim 8, wherein the first protective film comprises a first material and the second protective film comprises a second material, wherein the first material is the same as the second material.
12. The method of claim 8, wherein the plurality of interior components of the process chamber comprise stainless steel.
13. The method of claim 8, further comprising, prior to forming the second protective film, positioning a cover on at least a portion of the substrate support pedestal such that the second protective film is not formed on the substrate support pedestal.
14. The method of claim 8, wherein the at least one gas comprises fluorine.
15. The method of claim 8, further comprising, prior to forming the second protective film, heating the process chamber to a pre-heating temperature from about 300° C. to about 600° C., wherein forming the second protective film occurs while the chamber is at the pre-heating temperature.
16. A method of processing a substrate, comprising:
introducing at least one gas to a process chamber;

removing, in response to the introducing of the at least one gas in the process chamber, a first protective film from a plurality of interior components of the process chamber;

forming, via ALD or CVD, in the process chamber, a second protective film on the plurality of interior components comprising a chamber sidewall, a chamber bottom, a substrate support pedestal, a showerhead, and a chamber top, wherein the second protective film comprises amorphous Si, carbosilane, polysilicon, SiC, SiN, $SiO_2$, $Al_2O_3$, AlON, $HfO_2$, or $Ni_3Al$; and positioning, subsequent to forming the second protective film, a substrate on the substrate support pedestal, wherein the second protective film is not formed on a portion of the substrate support pedestal and the substrate is in contact with the portion of the substrate support pedestal that does not comprise the second protective film.

17. The method of claim 16, further comprising, prior to forming the second protective film, heating the process chamber to a pre-heating temperature from about 300° C. to about 600° C., wherein forming the second protective film occurs while the chamber is at the pre-heating temperature.

18. The method of claim 16, further comprising, prior to forming the second protective film, pressurizing the chamber from about 1 Torr to about 600 Torr.

19. The method of claim 16, further comprising, prior to positioning the substrate on the substrate support pedestal, setting a processing temperature of the chamber from about 200° C. to about 600° C.

20. The method of claim 16, further comprising, prior to positioning the substrate on the substrate support pedestal, a pressure of the chamber may be from 1 bar to about 250 bar.

* * * * *

UNITED STATES PATENT AND TRADEMARK OFFICE
CERTIFICATE OF CORRECTION

PATENT NO. : 10,704,141 B2
APPLICATION NO. : 16/383354
DATED : July 7, 2020
INVENTOR(S) : Sultan Malik et al.

It is certified that error appears in the above-identified patent and that said Letters Patent is hereby corrected as shown below:

On the Title Page

On the Page 3, in Column 2, item (56) under "Other Publications", Line 22, delete "mico-fin" and insert -- micro-fin --, therefor.

In the Specification

In Column 3, Line 48, delete "Hastealloy®." and insert -- Hastelloy®. --, therefor.

In Column 6, Line 37, delete "CVD),In" and insert -- (CVD). In --, therefor.

In Column 6, Lines 54-55, delete "of of" and insert -- of --, therefor.

Signed and Sealed this
Twenty-ninth Day of September, 2020

Andrei Iancu
*Director of the United States Patent and Trademark Office*